United States Patent
Bohmer et al.

(10) Patent No.: US 11,233,182 B2
(45) Date of Patent: Jan. 25, 2022

(54) METHOD OF MANUFACTURING A WAVELENGTH-CONVERTING PIXEL ARRAY STRUCTURE

(71) Applicant: Lumileds LLC, San Jose, CA (US)

(72) Inventors: Marcel Rene Bohmer, Eindhoven (NL); Jacques Heuts, Roermond (NL)

(73) Assignee: LUMILEDS LLC, San Jose, CA (US)

( * ) Notice: Subject to any disclaimer, the term of this patent is extended or adjusted under 35 U.S.C. 154(b) by 82 days.

(21) Appl. No.: 16/751,810

(22) Filed: Jan. 24, 2020

(65) Prior Publication Data

US 2020/0243729 A1 Jul. 30, 2020

(30) Foreign Application Priority Data

Jan. 25, 2019 (EP) .................... 19153688

(51) Int. Cl.
| | |
|---|---|
| H01L 33/50 | (2010.01) |
| G03F 7/075 | (2006.01) |
| G03F 7/16 | (2006.01) |
| H01L 27/15 | (2006.01) |
| H01L 33/60 | (2010.01) |

(52) U.S. Cl.
CPC .......... H01L 33/505 (2013.01); G03F 7/0757 (2013.01); G03F 7/16 (2013.01); H01L 27/156 (2013.01); H01L 33/60 (2013.01); *H01L 2933/0041* (2013.01); *H01L 2933/0058* (2013.01)

(58) Field of Classification Search
CPC ..... H01L 33/505; H01L 27/156; H01L 33/60; H01L 33/508; H01L 33/54; H01L 33/502; H01L 33/507

See application file for complete search history.

(56) References Cited

U.S. PATENT DOCUMENTS

| | | | |
|---|---|---|---|
| 2013/0210179 A1* | 8/2013 | Mei | ......................... H01L 33/50 |
| | | | 438/27 |
| 2013/0258638 A1 | 10/2013 | Wang et al. | |

(Continued)

FOREIGN PATENT DOCUMENTS

WO    2015/135839 A1    9/2015

OTHER PUBLICATIONS

From the EPO as the International Searching Authority, Notification of Transmittal of the International Search Report and the Written Opinion corresponding to PCT/EP2020/050867, dated Mar. 19, 2020, 13 pages.

(Continued)

*Primary Examiner* — Changhyun Yi

(57) ABSTRACT

Methods of manufacturing a wavelength-converting pixel array structure, methods of manufacturing a light-emitting device and light-emitting devices are described. A method of manufacturing a wavelength-converting pixel array structure includes forming, in a recess in a wafer, an array of photoresist blocks separated by gaps. A liquid precursor filler material is dispensed into the recess to fill the gaps with the liquid precursor filler material to form a grid. The photoresist blocks are removed to expose an array of cavities defined by walls in the grid. Each of the cavities is filled with a wavelength-converting material to form wavelength-converting pixels of the wavelength-converting pixel array structure.

20 Claims, 5 Drawing Sheets

(56) References Cited

U.S. PATENT DOCUMENTS

Figure 1:
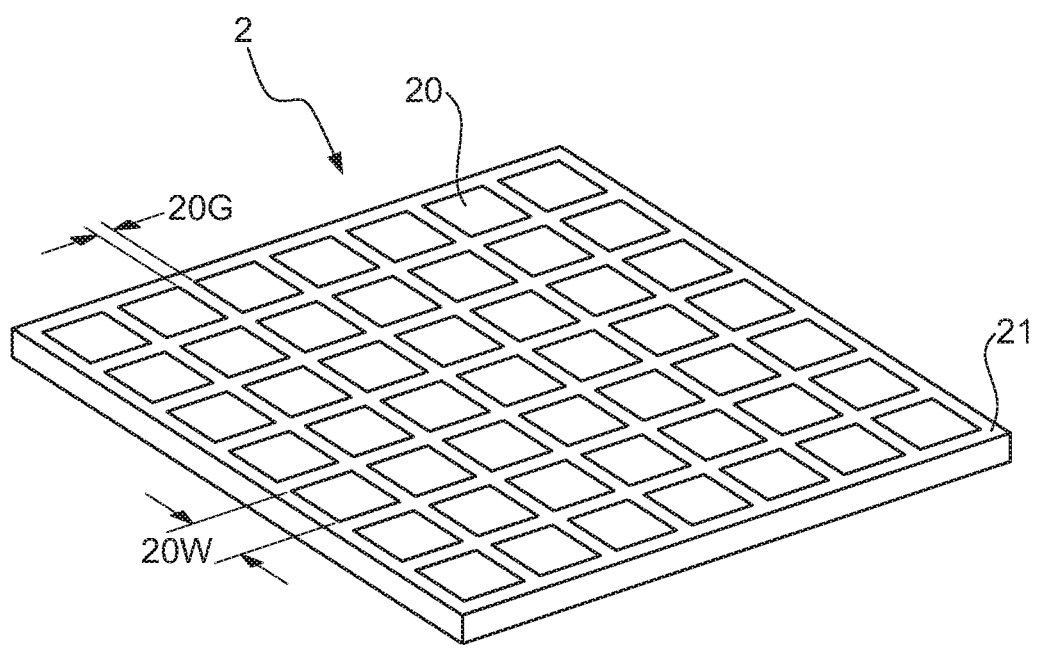

2015/0263254 A1* 9/2015 Miyoshi ............... H01L 33/505
                                                    257/98
2017/0062672 A1* 3/2017 Goeoetz ............... H01L 33/505
2017/0365755 A1   12/2017 Chu
2019/0027662 A1   1/2019 Saputra et al.

OTHER PUBLICATIONS

The extended European search report corresponding to EP application No. 19153688.7, dated May 28, 2019, 11 pages.

* cited by examiner

METHOD OF MANUFACTURING A WAVELENGTH-CONVERTING PIXEL ARRAY STRUCTURE

CROSS REFERENCE TO RELATED APPLICATION(S)

This application claims the benefit of EP Patent No. 19153688.7, filed on Jan. 25, 2019, which is incorporated by reference as if fully set forth.

FIELD OF INVENTION

The invention describes a method of manufacturing a wavelength-converting pixel array structure, and a method of manufacturing a light-emitting device.

BACKGROUND

With advances in light-emitting diode (LED) technology and manufacturing techniques, it is possible to manufacture arrays of high-power LEDs that are individually addressable. Such an array may be used in an application such as a camera flash to achieve a precise illumination "recipe" for a particular scene. The pixel size of an LED in such an array may be in micrometer range, for example 40 µm-200 µm. Such very small LEDs may be referred to as micro-LEDs. An array can comprise any number of such micro-LEDs. An array of several thousand such micro-LEDs may be used in an application such as an automotive lighting unit. Since the LED array should present a compact light source, it is desirable to have only a minimal spacing between the individual LEDs, so that these may, for example, be separated by "streets" that are only a few micrometres in width. Usually, the emission face or light-exit face of an LED is coated with a phosphor which can act as a wavelength-converting layer. In the context of this application, a light-emitting diode shall be understood to be a direct-emitting LED with an emission face that will be coupled into such a wavelength-converting layer. The LED's emission face may be referred to as the "light-emitting surface". In a closely-packed array of LEDs that are switched at the same time, it is cheaper to apply a single phosphor layer over the entire LED array since the optical crosstalk between the pixels of the LED array is not relevant. However, in an array of individually addressable LEDs, such cross-talk is not tolerable.

One way of overcoming the problem of optical crosstalk between LED array pixels is to deposit a phosphor layer or coating only on each LED emission face (avoiding the intervening spaces between LEDs) using a suitable patterning technique. The primary purpose of such a phosphor is wavelength conversion, and the layer thickness depends to a large extent on the properties of the phosphor particles and the desired color point. For a flash application, a phosphor layer thickness of about 50 µm is appropriate. In an automotive lighting application, a thinner phosphor layer of about 10 µm-20 µm may be sufficient. The phosphor layers will generally be square or rectangular, corresponding to the shapes of the LED emission faces, and will be separated by narrow gaps corresponding to the gaps or streets between LEDs (of course, other polygonal shapes are possible, for example hexagonal LED emission faces and corresponding hexagonal phosphor layer shapes). It is then necessary to fill these gaps by a reflecting material to ensure that any light exiting the side faces of the phosphor layer covering one LED will not enter the side faces of an adjacent phosphor layer. However, the gap between adjacent phosphor layers is very narrow. Furthermore, the height of the phosphor layer is significantly greater than the width of the gap, i.e. the space between adjacent phosphor layers has a high aspect ratio. In order to minimize crosstalk between array pixels, this space must be made reflective. This could be achieved by depositing a reflective side coat (e.g. using a metal such as silver) on the side faces of each phosphor region. A more economical approach would be to fill the gaps thoroughly (i.e. without any unintended cavities or discontinuities) with an encapsulant such as a polymerized siloxane (also referred to as polysiloxane or simply silicone) carrying a suspension of light reflecting or scattering particles. However, it is difficult to completely fill a narrow and deep gap with this type of relatively viscous material. As a result, the manufacture of an array of individually addressable phosphor-coated micro-LEDs can be unfavourably expensive. In an alternative approach, an array of wavelength-converting cells (a segmented phosphor array) may be provided by patterning a photoresist grid with dimensions that correspond to the spaces between the LEDs of an LED array. A reflective coating can then be applied onto the side walls of the photoresist grid. The cavities or cells defined by the grid may then be filled by a suitable phosphor. The photoresist grid remains in the structure. However, photoresist material is generally both light-sensitive and heat-sensitive, and such a photoresist grid may therefore deteriorate quite quickly, shortening the lifetime of the application in which it is used.

US 2019/027662 A1 discloses a method of manufacturing packaged light emitting devices. WO 2015/135839 A1 discloses a wavelength conversion element comprising at least one sintered wavelength converting material, wherein a grid is formed by channels within the sintered wavelength converting material. US 2017/365755 A1 discloses a method to fill a flowable material into gap regions of a semiconductor assembly module.

Therefore, it is an object of the invention to provide a way of producing a light-emitting device that does not suffer from the cross-talk problems described above.

SUMMARY

The object of the invention is achieved by a method of manufacturing a wavelength-converting pixel array structure, a method of manufacturing a light-emitting device, and a light-emitting device.

The wavelength-converting pixel array structure shall be understood to comprise an array of wavelength-converting pixels that are to be arranged over a corresponding array of LEDs. The wavelength-converting pixel array structure may be manufactured independently of the LED array. Preferably, the wavelength-converting pixel array structure is prepared for use with an array of closely-packed LEDs. The area covered by a photoresist block preferably corresponds to the area of the corresponding light-emitting diode, so that when the completed wavelength-converting pixel array structure is in place over an array of LEDs, the emission face of an LED is covered by the lower surface of a wavelength-converting pixel formed by filling the empty cell revealed upon removal of the photoresist block.

According to the invention, the method of manufacturing a wavelength-converting pixel array structure comprises the steps of forming an array of photoresist blocks, wherein the photoresist blocks are separated by gaps. The position of a photoresist block corresponds to the position of an LED in the LED array, so that the gaps between the photoresist blocks correspond to the streets between the LEDs of the LED array, and essentially define a grid negative. Since the streets between LEDs are generally very narrow, the gaps between the photoresist blocks essentially form a regular network of narrow "canyons" or trenches. This network of gaps or empty space enclosing the photoresist blocks may be referred to as the "negative space" in the following. In a next step, the negative space is filled to form a corresponding grid or regular network of narrow walls. The grid walls are formed by the filled gaps. The purpose of this filling step is to form a grid structure that essentially corresponds to the network of streets enclosing the LEDs of the LED array. In a next step, the photoresist blocks are removed from the grid structure, to expose an array of cavities or empty cells defined by the walls of the grid. Each empty cell is formed by the removal of a photoresist block. In a subsequent step, each empty cell is filled with a wavelength-converting material to form the pixels of the wavelength-converting pixel array. The wavelength-converting pixel array structure therefore essentially comprises the array of wavelength-converting pixels, and the grid which was formed by filling the negative space and which now encloses the wavelength-converting pixels.

An advantage of the inventive method is that a closely-packed array of wavelength-converting pixels can be achieved at a favourably low cost, since the steps can be carried out without difficulty and it is possible to use economically favourable materials. Furthermore, the cross-talk between the wavelength-converting pixels can be minimized or even eliminated by choosing a suitable material composition for the grid. For example, the material used to form the grid can be inherently reflective. Alternatively, after removing the photoresist blocks to reveal the grid, the side walls of the grid can be coated with a thin layer of reflecting material. An advantage of the invention is that it is much easier to apply a reflective layer onto the exposed side walls of the grid than it is to introduce reflective material into the narrow trenches between phosphor pixels.

According to the invention, the method of manufacturing a light-emitting device comprises the steps of providing an array of light-emitting diodes and manufacturing a wavelength-converting pixel array structure using the method described above. The wavelength-converting pixel array structure may be manufactured independently of the light-emitting diode array and may be mounted onto the light-emitting diode array. Alternatively, the wavelength-converting pixel array structure may be formed directly on the light-emitting diode array. In this way, it is possible to achieve—at favourably low cost—a light-emitting device with very low or negligible cross-talk between pixels.

The following description describes particularly advantageous embodiments and features, which may be combined as appropriate.

In the following, but without restricting the invention in any way, an LED may be assumed to emit blue light, and the emission face or light-emitting surface of the LED may be assumed to be coupled into a wavelength-converting layer. The white light leaving the phosphor layer of the LED (which may be referred to as a phosphor-converted LED or "pcLED") is a mixture of wavelength-converted light and unconverted blue light emitted by the LED. A desired colour point can be achieved by choosing a specific phosphor composition. A pcLED may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed for example to emit white light having a desired colour temperature. A cool white can be achieved by using a phosphor that converts blue light into yellow/green light. A warm white can be achieved by using a phosphor that performs conversion into yellow/green light as well as a phosphor that performs conversion into red light. The colour point of the light can be tuned by using a suitable composition of such phosphors for the wavelength-converting pixel array. Preferably, the light-emitting diode array is provided in wafer form, and the wavelength-converting pixel array structure is manufactured directly on the light-emitting diode array.

In a preferred embodiment of the invention, the width of a gap between adjacent photoresist blocks—and therefore also the width of a grid wall formed by filling the negative space—comprises at most 20 µm, more preferably at most 15 µm, most preferably at most 3 µm. Since the purpose of the phosphor pixel array structure is to provide wavelength-conversion elements for each LED, the photoresist blocks are deposited or formed so that the height of a photoresist block corresponds to the height of a wavelength conversion layer that will be deposited in the empty cell remaining after removal of that photoresist structure. Preferably, the height of a photoresist block—and therefore the height of a future wavelength-conversion pixel—is in the order of 10 µm-50 µm.

The photoresist blocks can be patterned or formed using any suitable technique. It may be assumed that a photoresist block is formed to have an essentially rectangular form, i.e. with a rectangular or square lower face, a corresponding upper face, and four side faces or side walls formed as two pairs of parallel opposite surfaces. For the purposes of explaining the invention, the upper and lower faces of the photoresist blocks are regarded as horizontal surfaces, while the side faces are regarded as vertical surfaces.

Once the photoresist blocks are in place, the negative space is filled to form the grid structure, for example using a suitable silicone filler in liquid form. In a particularly preferred embodiment of the invention, the liquid precursor filler material is allowed to flow into the negative space. This step may be referred to as the filler inflow process. A silicone suspension used for this kind of purpose is generally presented in liquid form and can be cured at an appropriate curing temperature. After curing to form the grid positive and removal of the photoresist blocks, the thin and relatively high grid walls can be coated with a reflective material.

Alternatively, the grid can be formed by applying a soft lithography technique to fill the negative space around each photoresist block with a suitable material such as a silicone.

In a filler inflow process, the filler material used to fill the negative space preferably comprises liquid silicone carrying a suspension of reflective and/or scattering particles. Any suitable particles may be used, such as titanium dioxide, zirconia, porous silica, magnesium fluoride, silver, metal flakes, etc. A suitable composition may be a 5% $TiO_2$ suspension in silicone, which is widely used as an LED encapsulant. Since some types of photoresist cannot withstand the high temperatures needed for curing silicones that are used in LED applications, alternative curing mechanisms such as ultraviolet-curing, or curing from the gas phase, may be preferred. Such techniques can also ensure sufficient rigidity to the grid structure after removal of the photoresist.

In a preferred embodiment of the invention, the top surfaces of the photoresist blocks are cleaned after the negative space has been filled to form the grid. To facilitate cleaning of the upper surfaces of the photoresist blocks, a fluorination of these surfaces can be carried out using a suitable substance, for example a fluorinated silane. The upper surfaces of the photoresist blocks may need to be cleaned to avoid formation of thin layers (skins) of cured filler material on the upper surfaces of the photoresist blocks. If such a skin or layer of cured filler material extends over much of a photoresist block, it may even prevent removal (stripping) of that photoresist block. Therefore, in a preferred embodiment of the invention, the upper surfaces of the photoresist blocks are cleaned by dry wiping, wet wiping, or by rinsing with a solvent that does not affect the photoresist. If a tool such as a blade is used to clean the upper surfaces of the photoresist blocks, the blade is preferably guided by a tool or device that ensures that the edge of the blade is maintained at the upper level of the photoresist block array. Alternatively, grinding or polishing may be performed to remove the excess material from the top surfaces of the photoresist blocks.

As mentioned above, the filler material used to fill the gaps on all sides of the photoresist blocks can comprise a silicone containing a suspension of scattering particles. Alternatively, the filler material can be essentially clear, and the method can comprise a step of depositing a reflective coating on the vertical side faces of the grid walls. For example, a silver or aluminium mirror or a Bragg reflector coating can be applied to the grid side walls using a suitable technique, for example using atomic layer deposition to form a Bragg reflector coating.

As mentioned above, the gaps between photoresist blocks are filled by a liquid filler material that must be allowed to harden or cure. However, the relatively high curing temperature of a polysiloxane may result in undesirable alterations in the photoresist material, making it difficult or impossible to remove the photoresist blocks from the grid. Therefore, in a preferred embodiment of the invention, the method comprises a first curing step at a temperature that is lower than the recommended curing temperature of the filler material. The first curing conditions (temperature and duration) are chosen to ensure that the chemical composition of the photoresist is not altered. In this first curing step, the filler material is only partially cured, but sufficiently stable so that the photoresist blocks can then be removed, for example using a suitable solvent as explained above. After removal of the photoresist blocks, the method comprises a second curing step, at a higher temperature, to completely cure the filler material and to form the grid. Once the grid has been completely cured, the cavities revealed upon removal of the photoresist blocks can then be filled with the wavelength-converting material. Alternative curing mechanisms such as UV-curing or curing from the gas phase can be used to give sufficient rigidity to the grid structure after removal of the photoresist.

For optimal performance of the light-emitting diode array, each wavelength-converting pixel should be surrounded by reflective walls of the grid in the wavelength-converting pixel array structure. Therefore, to ensure that a liquid filler material can be used to also form a wall about the outer edges of the photoresist block array, the photoresist blocks are preferably formed in a suitable container. The negative space (to be filled by the filler material) therefore comprises the narrow gaps or canyons between adjacent photoresist blocks, as well as the empty space between the photoresist block array and the container side walls. For example, the photoresist blocks can be formed on a horizontal base or floor of the container, and the side walls of the container are preferably no higher than the intended height of the photoresist blocks (i.e. the desired thickness of the future wavelength-converting layers). This can be achieved by using a foil or other thin sheet of a suitable material with an opening that is larger than the LED array. The thickness of this foil or sheet corresponds to the thickness of the desired wavelength-converting layer. The sheet is put into place on the surface onto which the photoresist blocks will be patterned. The sheet can be glued into place, for example by providing it with an adhesive backing. The photoresist blocks are then patterned, and the liquid filler is then poured into the "container" formed by the opening in the sheet.

In a preferred embodiment of the invention, the light-emitting diode array is provided at the base of a recess formed or etched in the wafer (in a reactive-ion etching process) to a depth corresponding to the height of the photoresist blocks. This recess or "container" can facilitate the distribution of a liquid filler material. For example, in a preferred embodiment of the invention, the liquid filler material is diluted by a suitable solvent to decrease its viscosity, and the step of filling the gaps around the photoresist blocks can be carried out by dispensing the diluted liquid filler into the recess so that the very narrow gaps between the photoresist blocks are filled by capillary action. The solvent used to dilute the filler material is preferably one that does not swell the photoresist. An advantage of this approach is that the dispensing process can be stopped as soon as the liquid filler has reached the desired level, i.e. the process is stopped as soon as all trenches or gaps are filled, so that the liquid filler will therefore not spread onto the upper surfaces of the photoresist. Using this approach, since the liquid filler will not coat the upper surfaces of the photoresist blocks, there is no need to clean these upper surfaces before removing the photoresist blocks from the cured grid.

In a preferred embodiment of the invention, the photoresist blocks are then removed by dissolving the photoresist using a suitable solvent. For example, a standard stripping solvent may be used, e.g. dimethyl sulfoxide (DMSO). Alternatively a dry etching method may be used to remove the photoresist blocks. Once the photoresist has been removed to expose the empty cells, the side walls of the grid can be made reflective as described above, for example by applying a silver or aluminium layer onto the side walls of the grid, or by carrying out atomic layer deposition to form a Bragg reflector coating.

As described above, the empty cells or cavities, created by removal of the photoresist blocks, are then filled with a wavelength-converting material or phosphor to form the wavelength-converting pixels of a wavelength-converting pixel array. The skilled person will be familiar with the appropriate techniques such as blade coating, spray coating, electrophoretic deposition, etc. The phosphor(s) can be chosen according to the intended function of the wavelength-converting material. The phosphor(s) can be mixed with a suitable encapsulant resin or silicone, preferably an encapsulant with favourable temperature stability. An alternative approach is to arrange phosphor particle sediment in the empty cells, followed by drying and application of a material that binds the particles, for example using a sol-gel method or a method of atomic layer deposition. The terms "wavelength-converting material" and "phosphor" may be used interchangeably in the following.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWING(S)

Figure 2:
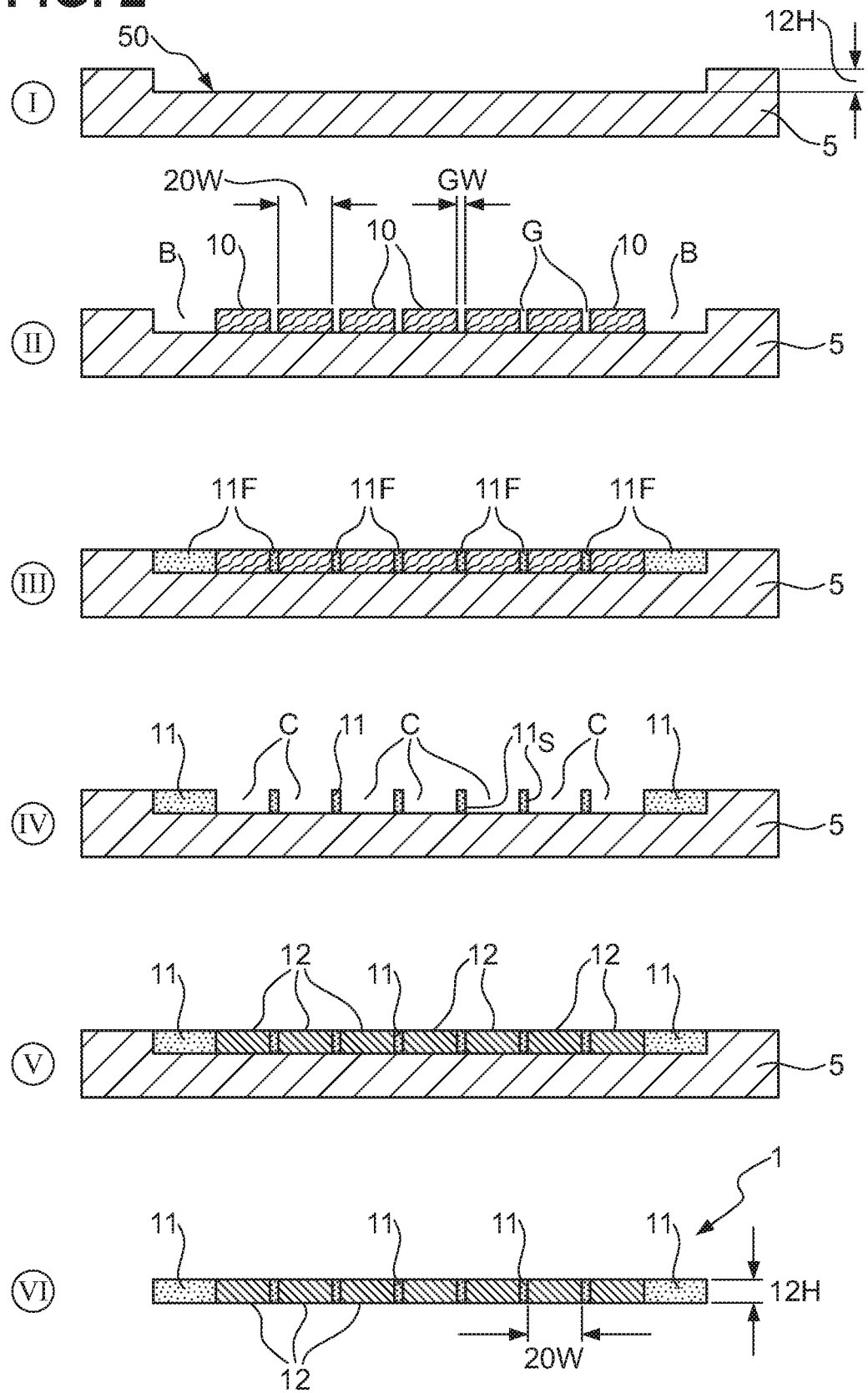
Figure 3:
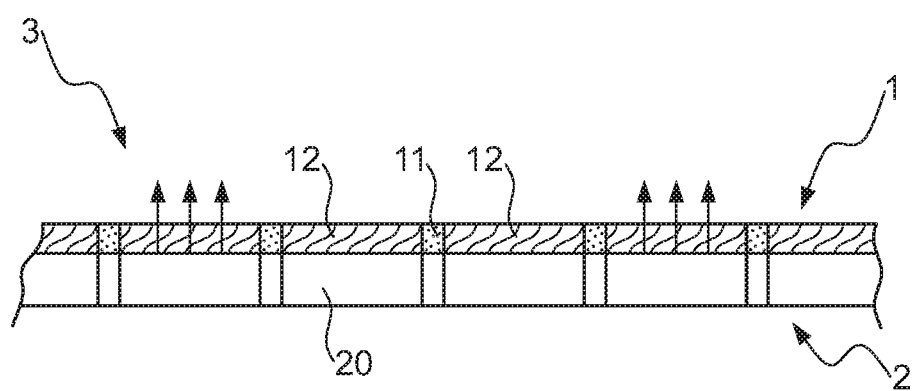
Figure 4:
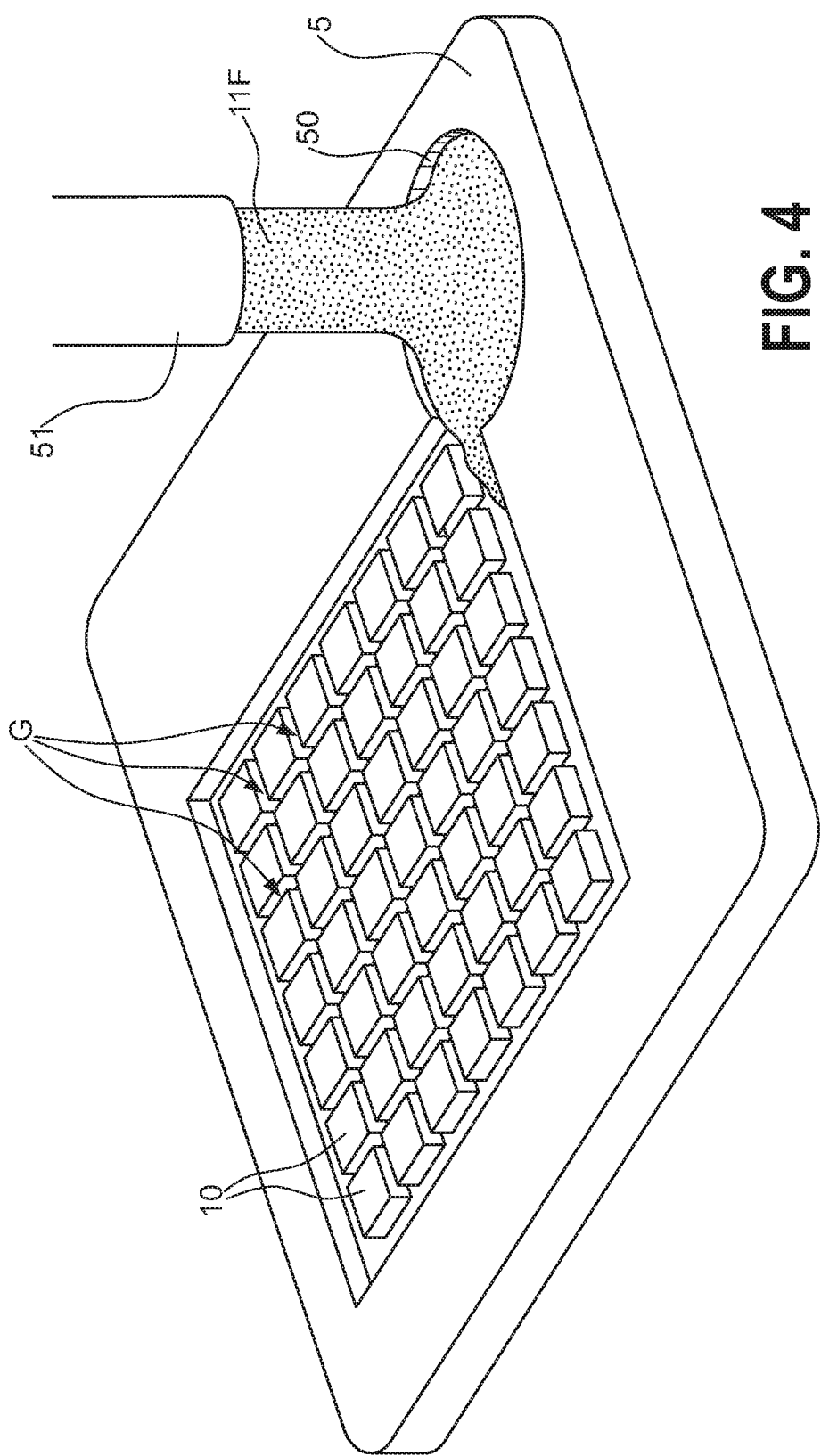
Figure 5:
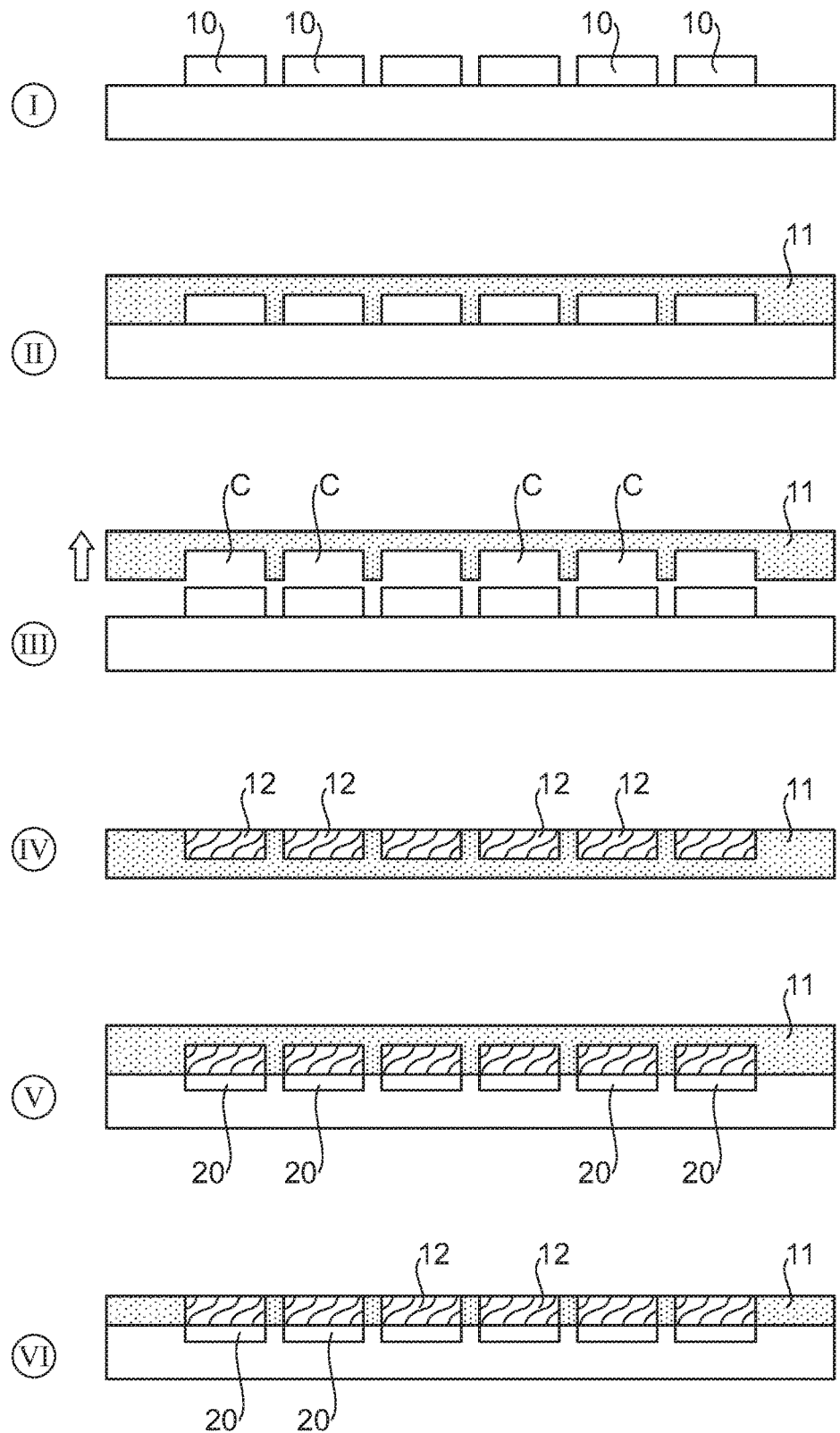

FIG. 1 shows an array of LEDs;
FIG. 2 shows stages in an embodiment of the inventive method of manufacturing a wavelength-converting pixel array structure;
FIG. 3 shows a simplified schematic of an embodiment of the inventive light-emitting device;
FIG. 4 is a simplified diagram showing a stage in an embodiment of the inventive manufacturing method;
FIG. 5 shows stages in an alternative embodiment of the inventive method of manufacturing a wavelength-converting pixel array structure.

In the drawings, like numbers refer to like objects throughout. Objects in the diagrams are not necessarily drawn to scale.

DETAILED DESCRIPTION OF THE PREFERRED EMBODIMENT(S)

FIG. 1 shows an LED array 2 comprising an exemplary 7×7 array of 49 micro-LEDs 20 formed in a wafer 21. Here, each LED 20 has an essentially square emission surface, with a side length 20W in the order of 40 µm-200 µm. The LED array 2 can be connected to a driver (not shown) in such a way that each LED 20 is individually addressable. The gaps 20G between the LEDs 20 can have a width of as little as 8 µm. Much larger arrays of micro-LEDs are possible, for example 100×100 micro-LEDs.

FIG. 2 shows stages of the inventive method of manufacturing a wavelength-converting pixel array structure 1 for use with an array of micro-LEDs as described in FIG. 1.

In a first stage I, a container 5 is provided. This can be a wafer into which a shallow recess 50 has been etched, for example. The depth 50 of the container 5 corresponds to the thickness of a wavelength-converting pixel. Alternatively, the container 5 can be formed by attaching a cut-out sheet or foil of thickness 50 onto a suitable carrier such as smooth glass or metal. The cut-out in the sheet or foil will then form the side walls of the recess 50, and the upper surface of the carrier will form the floor or base of the recess 50. Alternatively, a recess can be formed by depositing a surround or enclosure in the following stage.

In a second stage II, photoresist blocks 10 are patterned on the floor of the container 5, to a height that corresponds to the depth 1211 of the container 5, so that the height 1211 or thickness of a photoresist block 10 also corresponds to the thickness 1211 of a wavelength-converting pixel. The width 20W of a photoresist block 10 corresponds to the width 20W of an LED 20 of the LED array. The photoresist blocks 10 are deposited or patterned to leave narrow trenches or gaps G between adjacent photoresist blocks 10 (corresponding to the streets between the LEDs of the LED array). The width GW of a gap G corresponds to the spacing 20W between LEDs 20 of the LED array 2 described in FIG. 1. A border B or "moat" surrounds the array of photoresist blocks 10, and will be used during the subsequent filling step.

In a third stage III, a liquid filler 11F is poured into the container 5 and allowed to surround the photoresist blocks 10 in the border region, from which it can enter the gaps G between the photoresist blocks 10, so that the liquid filler 11F fills the negative space about the photoresist blocks 10. In this exemplary embodiment, it may be assumed that the liquid filler 11F is a silicone carrying a suspension of scattering particles, and may be diluted using an appropriate solvent that does not affect the photoresist material. Dispensing of the liquid filler 11F is halted as soon as the level of the liquid filler 11F has reached the upper level of the photoresist blocks 10, i.e. the liquid fills the container 5. The liquid filler is then cured. In case the photoresist is unable to withstand the silicone curing temperature, the liquid filler 11F is only partially cured at a temperature that is lower than the recommended curing temperature of the silicone, or fully cured using a suitable UV-curing or gas phase curing technique as described above. The liquid filler material 11F undergoes cross-linking during curing to become the solidified grid 11, comprising the narrow grid walls formed by filling the gaps G between the photoresist blocks 10, and a wider frame formed by filling the border B surrounding the array of photoresist blocks 10.

In a fourth stage IV, the photoresist blocks 10 are removed or stripped using a suitable solvent, for example, or by plasma etching from the gas phase. Cavities or empty cells C are revealed upon removal of the photoresist blocks 10. A grid 11 of the partially cured filler is also revealed. The grid 11 is then completely cured in a second curing step, at the recombined curing temperature. The vertical side faces 11S of the cured grid 11 could be coated as described above with a reflective material at this stage, for example by deposition of a Bragg reflector. At a later stage, any such coating that is deposited on a horizontal surface of the grid can be removed using a suitable technique.

In a fifth stage V, the empty cells C are filled with a suitable phosphor composition such as a phosphor slurry, to form an array of wavelength-converting pixels 12. The phosphor composition is deposited to the same height as the grid 11, using a suitable technique such as blade coating, spray coating, electrophoretic deposition, etc. The completely cured grid 11 is robust enough to retain its shape during the cavity filling procedure.

In a final stage VI, the completed wavelength-converting pixel array structure 1 can be removed from the container 5. It can then be mounted over the LED array. If necessary, the wider outer portion of the grid 11 can be cut to size.

FIG. 3 shows a simplified cross-section through of an embodiment of the inventive light-emitting device 3. Here, an embodiment of the inventive wavelength-converting pixel array structure 1 as explained in FIG. 2 is in place over the LED array 2 described in FIG. 1, to give an array of phosphor-converted LEDs. The diagram shows that the positions of the wavelength-converting pixels 12 essentially match the positions of the LEDs 20, and the grid 11 is essentially a continuation of the spaces 20G between the LEDs 20. Each LED 20 and its wavelength-converting pixel 12 is a pcLED. Because the grid 11 is reflective, any light (indicated by the exemplary upward pointing arrows) emitted by one of the LEDs 20 and passing through its wavelength-converting pixel 12 will not be able to enter any adjacent wavelength-converting pixel 12, so that crosstalk between the wavelength-converting pixels 12 does not arise.

FIG. 4 is a simplified diagram showing a stage in the inventive manufacturing method, when a liquid filler 11F is being dispensed into a reservoir at a corner of the container 5. For example, if the container 5 is formed from the same wafer as the LEDs, the recess 50 is etched to also include the reservoir. The liquid filler 11F can be dispensed from a nozzle 51 of a suitable dispensing means, as will be known to the skilled person. An array of photoresist blocks 10 has previously been patterned on the base of a recess in the container 5, to the same height as the container 5. The diagram serves to illustrate that the liquid filler 11F—especially if diluted using a suitable solvent—is free to flow into the recess in the container 5 and to arrive at the gaps G between the photoresist blocks 10 from all sides of the array of photoresist blocks 10. Once the liquid filler 11F has filled the recess 50 and all the gaps G, it is cured to form a solid grid, after which the photoresist blocks 10 can be removed to expose empty cells or cavities defined by the grid walls.

FIG. 5 shows steps in an alternative soft lithography process. In step I, an array of blocks 10 is patterned on a suitable substrate. In step II, a grid 11 is formed using a soft lithography technique. In step III, the grid 11 is lifted off the blocks 10. In step IV, the grid is inverted and the empty cells C are filled with a wavelength converting material such as phosphor. In step V, the wavelength-converting pixel array structure 1 is inverted and placed over an array of LEDs 20 (provided in the form of a wafer). In step VI, the excess material is removed to expose the wavelength-converting pixels 12.

Although the present invention has been disclosed in the form of preferred embodiments and variations thereon, it will be understood that numerous additional modifications and variations could be made thereto without departing from the scope of the invention. For example, the grid can be formed by filling the gaps between photoresist blocks using a $TiO_2$ (titanium dioxide) suspension and a sol-gel binder in an inflow process to obtain a porous light-scattering material. To control evaporation of a solvent used in the inflow process, a low vapour pressure, or control of the vapour pressure, may be desirable.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

What is claimed is:

1. A method of manufacturing a wavelength-converting pixel array structure, the method comprising:
   forming, in a recess in a wafer, an array of photoresist blocks separated by gaps;
   dispensing a liquid precursor filler material into the recess to fill the gaps with the liquid precursor filler material to form a grid;
   removing the photoresist blocks to expose an array of cavities defined by walls in the grid; and
   filling each of the cavities with a wavelength-converting material to form wavelength-converting pixels of the wavelength-converting pixel array structure.

2. The method according to claim 1, wherein the dispensing the liquid precursor filler material comprises dispensing a reflective liquid precursor filler material.

3. The method according to claim 2, wherein the dispensing the reflective liquid precursor filler material comprises dispensing a polymerized siloxane carrying a suspension of scattering particles.

4. The method according to claim 1, wherein the dispensing the liquid precursor filler material to fill the gaps further comprises allowing the liquid precursor filler material to flow into the gaps.

5. The method according to claim 1, wherein the dispensing the liquid precursor filler material to fill the gaps further comprises performing a soft lithography technique to fill the gaps with the liquid precursor filler material.

6. The method according to claim 1, wherein the forming the array of photoresist blocks comprises forming the array of photoresist blocks separated by a gap having a width of at most 20 µm.

7. The method according to claim 1, wherein the dispensing the liquid precursor filler material comprises partially curing the liquid precursor filler material after the liquid precursor filler material has flowed into the gaps to form the grid; and
   after removing the photoresist blocks, fully curing the liquid precursor filler material that has been partially cured.

8. The method according to claim 1, wherein the forming the array of photoresist blocks comprises forming the array of photoresist blocks separated by a gap having a width of at most 3 µm.

9. The method according to claim 1, wherein the forming the array of photoresist blocks comprises forming the array of photoresists blocks having a height corresponding to a desired height of the wavelength-converting pixels.

10. The method according to claim 1, further comprising cleaning upper surfaces of the photoresist blocks after filling the gaps with the liquid precursor filler material.

11. The method according to claim 1, further comprising depositing a reflective coating on the walls in the grid after removing the photoresist blocks to expose the array of cavities in the grid.

12. The method according to claim 1, wherein the forming the array of photoresist blocks comprises forming each of the photoresist blocks to cover an area of a bottom surface of the recess in the wafer that corresponds to an area of a corresponding light-emitting diode over which the photoresist block is to be disposed.

13. The method according to claim 1, wherein the recess in the wafer has a height corresponding to a desired height of the wavelength-converting pixels.

14. The method according to claim 1, further comprising removing the wavelength-converting pixel array structure from the wafer.

15. A method of manufacturing a light-emitting device, the method comprising:
   providing an array of light-emitting diodes;
   manufacturing a wavelength-converting pixel array structure by:
      forming, in a recess in a wafer, an array of photoresist blocks separated by gaps,
      dispensing a liquid precursor filler material into the recess to fill the gaps with the liquid precursor filler material to form a grid,
      removing the photoresist blocks to expose an array of cavities defined by walls in the grid, and
      filling each of the cavities with a wavelength-converting material to form wavelength-converting pixels of the wavelength-converting pixel array structure; and
   mounting the wavelength-converting pixel array structure onto the light-emitting diode array.

16. The method according to claim 15, wherein the light-emitting diode array is provided in wafer form.

17. A light-emitting device comprising:
   a light-emitting diode array comprising a plurality of light-emitting diodes separated by gaps; and
   a wavelength-converting pixel array structure on the light-emitting diode array, the wavelength-converting pixel array structure comprising a grid of wavelength-converting pixels separated and surrounded by narrow grid walls of a cured liquid precursor filler material, with each of the wavelength-converting pixels disposed over a respective one of the light-emitting diodes, and
   the cured liquid precursor filler material comprising the narrow grid walls extending to form a border enclosing the light-emitting diode array, the border comprising a first portion disposed adjacent to an outermost wavelength converting pixel of the grid of wavelength-converting pixels, having a greater width than each of the narrow grid walls, and having a planar top surface level with top surfaces of the wavelength-converting pixels and the narrow grid walls.

18. The device according to claim 17, wherein the narrow grid walls and the border of the cured liquid precursor filler material each have a same height as the grid of wavelength-converting pixels, and the grid of wavelength-converting pixels is in direct contact with the light-emitting diodes.

19. The device according to claim 17, wherein the cured liquid precursor filler material comprises a polymerized siloxane carrying a suspension of scattering particles.

20. The device according to claim 17, wherein the plurality of wavelength-converting pixels are separated from neighboring wavelength-converting pixels by a gap having a width of at most 20 μm.

* * * * *